(12) United States Patent
Lin et al.

(10) Patent No.: US 11,362,009 B2
(45) Date of Patent: Jun. 14, 2022

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Sheng-Ta Lin, Miaoli County (TW); Chun-Lin Lu, Hsinchu (TW); Kai-Chiang Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/096,967

(22) Filed: Nov. 13, 2020

(65) Prior Publication Data
US 2022/0157677 A1    May 19, 2022

(51) Int. Cl.
| | |
|---|---|
| H01L 21/56 | (2006.01) |
| H01L 23/31 | (2006.01) |
| H01L 23/66 | (2006.01) |
| H01Q 1/22 | (2006.01) |
| H01L 23/00 | (2006.01) |
| H01L 21/768 | (2006.01) |
| H01L 21/78 | (2006.01) |
| H01L 23/538 | (2006.01) |

(52) U.S. Cl.
CPC ............ *H01L 23/31* (2013.01); *H01L 21/563* (2013.01); *H01L 21/76802* (2013.01); *H01L 21/78* (2013.01); *H01L 23/5384* (2013.01); *H01L 23/66* (2013.01); *H01L 24/94* (2013.01); *H01Q 1/2283* (2013.01)

(58) Field of Classification Search
CPC . H01L 23/31; H01L 21/563; H01L 21/76802; H01L 21/78; H01L 23/5384; H01L 23/66; H01L 24/94; H01Q 1/2283
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2020/0313278 A1* | 10/2020 | Liang | H01L 23/66 |
| 2021/0013585 A1* | 1/2021 | Ho | H01Q 1/2283 |

(Continued)

*Primary Examiner* — Nicholas J Tobergte
(74) *Attorney, Agent, or Firm* — JCIPRNET

(57) ABSTRACT

Provided is a package structure and a method of fabricating the same. The package structure includes a die; a first encapsulant, laterally encapsulating the die; a first redistribution structure, disposed on the first encapsulant and the die; a second encapsulant, disposed on the first redistribution structure; an antenna pattern, embedded in the second encapsulant and electrically connected to the first redistribution structure; and a dielectric layer, covering the antenna pattern, wherein an upper surface of the second encapsulant is exposed by the dielectric layer, and a laser mark is formed within the upper surface of the second encapsulant.

11 Claims, 21 Drawing Sheets

(56) References Cited

U.S. PATENT DOCUMENTS

2021/0020577 A1\* 1/2021 Hu .................... H01L 23/3128
2021/0035928 A1\* 2/2021 Kuo ................... H01L 21/6835
2021/0343664 A1\* 11/2021 Chang ................. H01Q 21/065

\* cited by examiner

PACKAGE STRUCTURE AND METHOD OF FABRICATING THE SAME

BACKGROUND

Semiconductor devices and integrated circuits are used in a variety of electronic applications, such as personal computers, cell phones, digital cameras, and other electronic devices. As the demand for shrinking electronic devices has grown, a need for smaller and more creative packaging techniques of semiconductor devices has emerged. Thus, packages such as wafer-level packaging (WLP) have begun to be developed. For example, the dies of the wafer may be processed and packaged with other semiconductor devices (e.g. antenna) at the wafer-level. In addition, since the demand of modern communication for more bandwidth, high performance package designs with integrated antenna are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
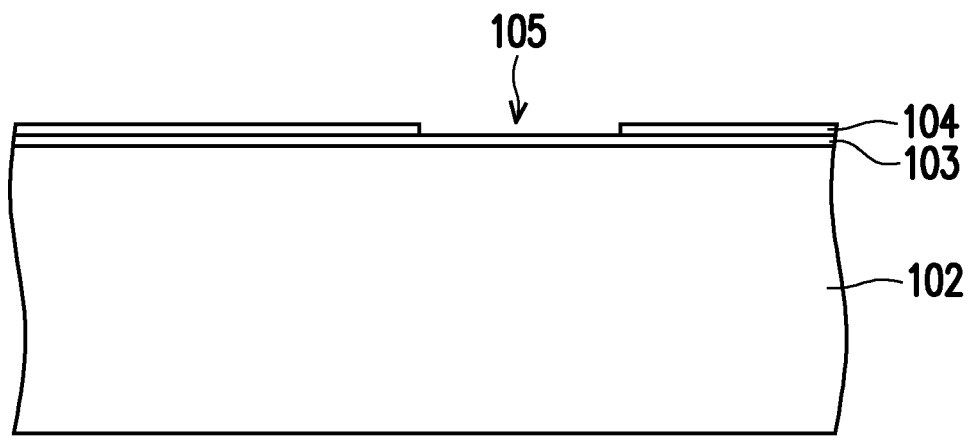
FIG. 1 to FIG. 13 are cross-sectional views of a method of fabricating a package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A package with an antenna pattern is manufactured by a number of operations. A polyimide layer is formed to cover the antenna pattern, thereby protecting the antenna pattern from some damages. A laser marking is then performed on the polyimide layer to form a laser mark for identification. As the laser beam is projected on the polyimide layer, some portions of the polyimide layer would be ablated or melted. These residual portions of the polyimide layer would blur the laser mark and thus the laser mark could not be clearly seen. The package with a blurred laser mark would be eliminated from subsequent manufacturing operations and thus would cause material wastage.

Furthermore, as the laser mark on the polyimide layer would be used for alignment or identification during subsequent operations, the die with the blurred laser mark would not be aligned accurately or would not be identified correctly by machines upon subsequent operation, and thus would potentially have a high yield loss or poor reliability.

In accordance with some embodiments, a dielectric material is patterned to form a dielectric layer with an opening before forming the encapsulant. Thereafter, the encapsulant is formed to extend between the opening in the dielectric layer. After releasing the carrier, the dielectric layer overlays the antenna pattern for protection, while the dielectric layer exposes the encapsulant. In case of the dielectric overlying the antenna pattern, a laser marking is then performed on the encapsulant to form a laser mark in the encapsulant. In such embodiment, the laser mark is clearly engraved on the encapsulant and no residue is disposed on or adjacent to the laser mark. That is, the performance of the laser marking and the clarity of the laser mark are improved.

FIG. 1 to FIG. 13 are cross-sectional views of a method of fabricating a package structure in accordance with some embodiments. FIG. 14 is a schematic top view illustrating a relative position between antenna patterns and isolation structures of a package structure in accordance with some embodiments.

Referring to FIG. 1, a carrier 102 is provided. In some embodiments, the carrier 102 may be a glass carrier or any suitable carrier for the manufacturing method of the package structure. Specifically, the carrier 102 is provided with a de-bonding layer 103 and a dielectric layer 104 formed thereon. In some embodiments, the de-bonding layer 103 functions as a temporary bonding layer suitable for bonding/debonding the carrier 102 from the above layers disposed thereon. In some embodiments, the de-bonding layer 103 is a light-to-heat conversion (LTHC) release layer formed on carrier 102. In some alternative embodiments, the de-bonding layer 103 may be a photo-curable release film whose viscosity is decreased by photo-curing process or a thermal curable release film whose viscosity is decreased by thermal-curing process.

The dielectric layer 104 may be formed by depositing a dielectric material (not shown) on the de-bonding layer 103, and then patterning the dielectric material by photolithographic and etching processes to form an opening 105. The opening 105 may expose the underlying de-bonding layer 103. In some embodiments, the dielectric material includes an organic dielectric material, an inorganic dielectric material, or a combination thereof. The organic dielectric material may include a polymer material. The polymer material includes a photosensitive material, a non-photosensitive material, or a combination thereof. In some embodiments, the photosensitive material includes polyimide (PI), benzocyclobutene (BCB), polybenzooxazole (PBO), the like, or a combination thereof. The non-photosensitive material includes ABF. The inorganic dielectric material is, for example, silicon oxide, silicon nitride, silicon oxynitride, or a combination thereof. In addition, the dielectric material may be deposited by chemical vapor deposition, spin coating, or lamination. Although the dielectric layer 104 illustrated in FIG. 1 is a single-layered structure, the embodiments of the present invention are not limited thereto. In other embodiments, the dielectric layer 104 may include a bi-layered or multi-layered structure.

Figure 2:
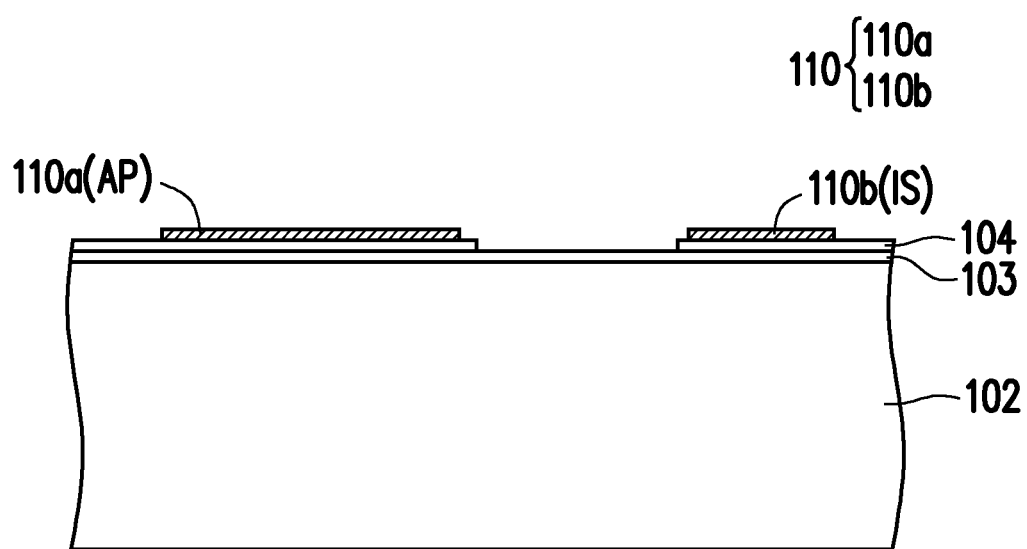

Referring to FIG. 2, a conductive layer 110 is formed on the dielectric layer 104. In some embodiments, the conductive layer 110 is formed by forming a conductive material (not shown) on the dielectric layer 104 and the de-bonding layer 103, and then patterning the conductive material by photolithographic and etching processes. In some embodiments, a material of the conductive layer 110 includes a metal material, such as aluminum, titanium, copper, nickel, tungsten, and/or alloys thereof.

In some embodiments, the conductive layer 110 at lease includes a first conductive pattern 110a and a second conductive pattern 110b. The first conductive pattern 110a may include a plurality of antenna patterns AP. In some embodiments, the antenna patterns AP are arranged as arrays such as the N×N array or N×M arrays (N, M>0, N may or may not be equal to M). The size of the array for the antenna patterns AP may be designated and selected based on the demand, and is not limited to the disclosure. In certain embodiments, the antenna patterns AP may include conductive blocks arranged in arrays, and in a top view, the shapes of the conductive blocks of the antenna patterns AP may be round, elliptical, oval, square, rectangular, tetragonal, hexagonal, octagonal, or any suitable polygonal shape. The second conductive pattern 110b may include a plurality of isolation structures IS. In some embodiments, the antenna patterns AP and the isolation structures IS are physically separated or isolated from one another, and the antenna patterns AP are surrounded by the isolation structures IS.

Figure 11:
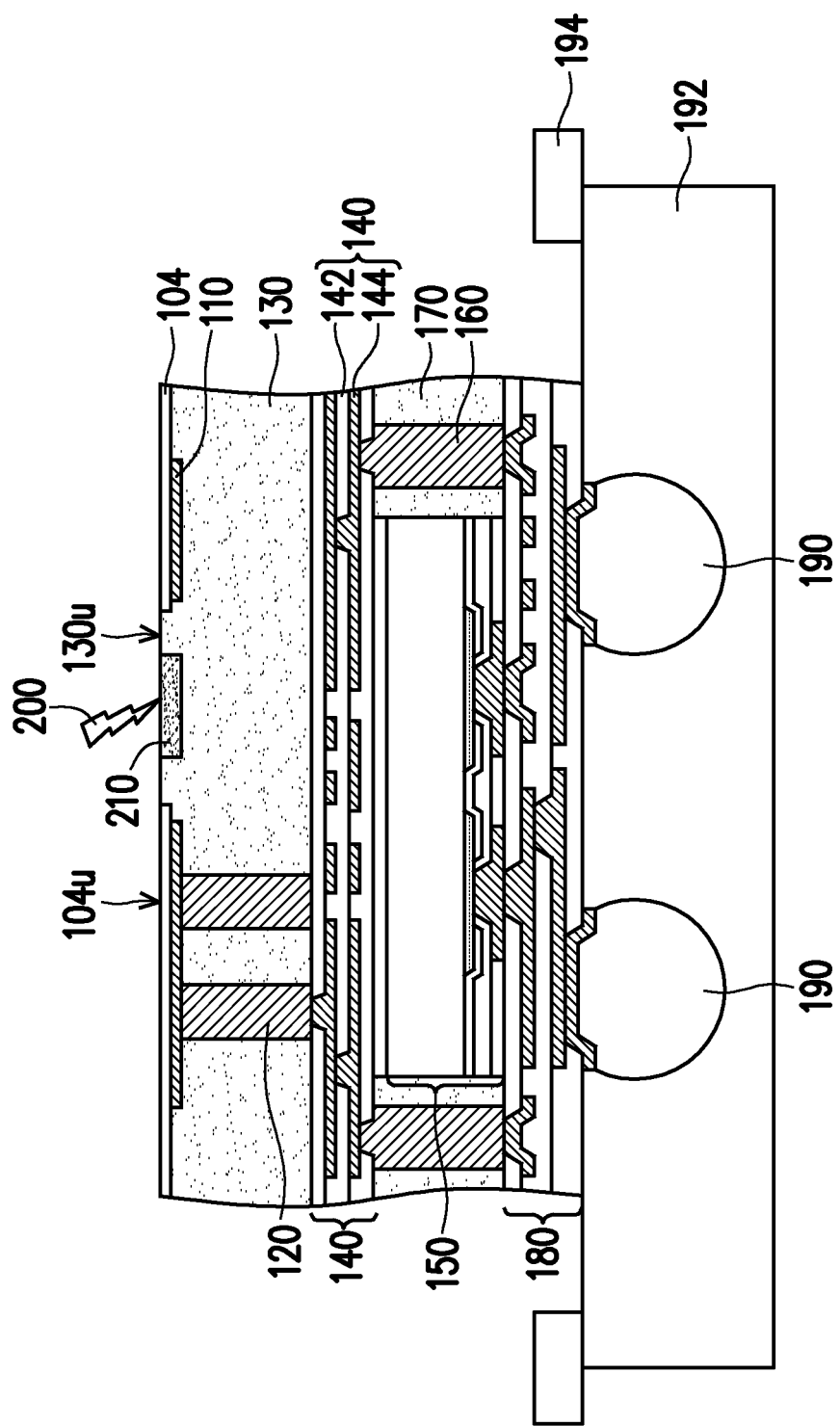
Figure 12:
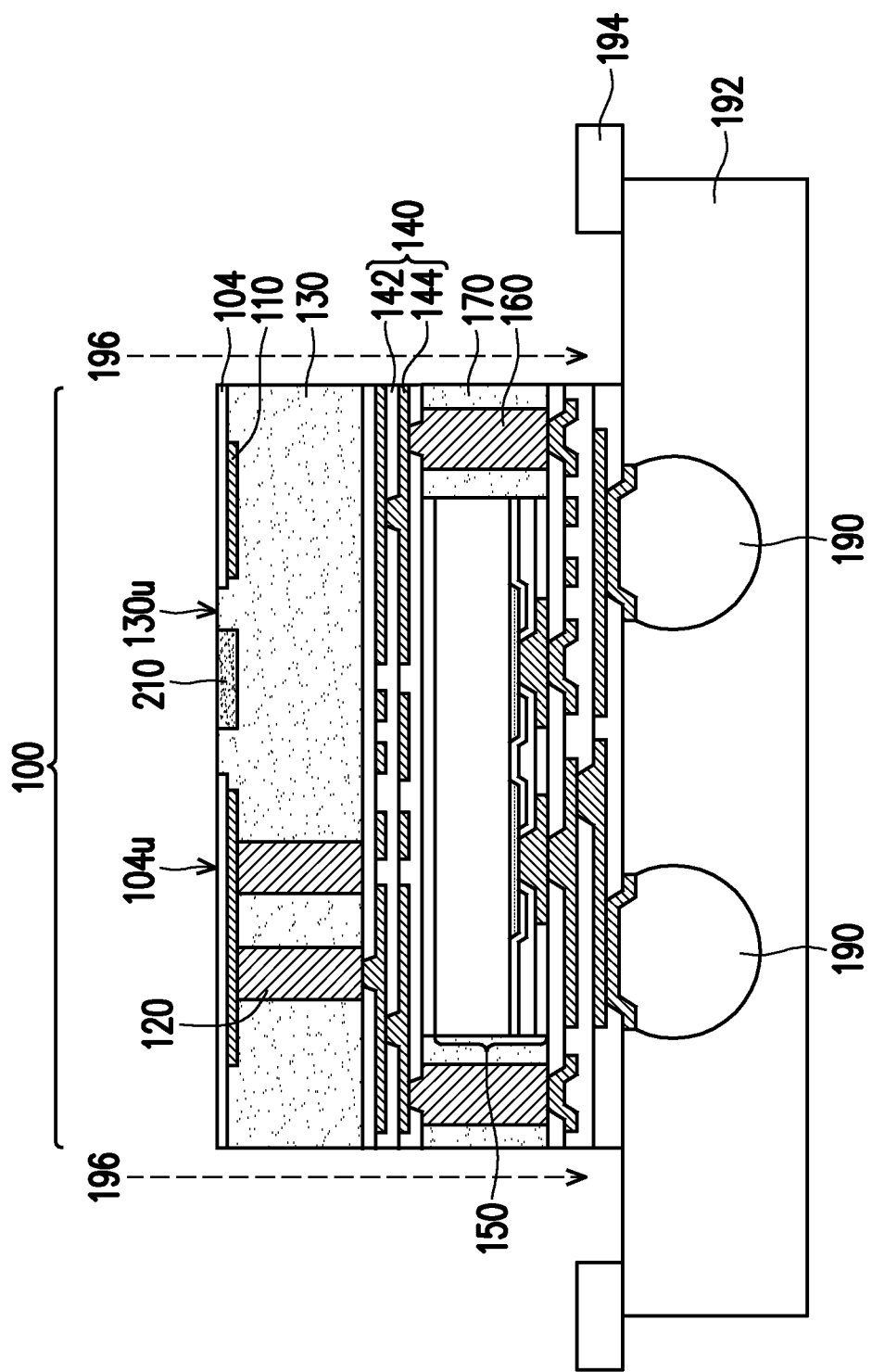

For example, as shown in FIG. 14, the antenna patterns AP may include four antenna patterns AP1, AP2, AP3, AP4, the isolation structures IS may include four isolation structures IS1, IS2, IS3, IS4, and the antenna patterns AP1, AP2, AP3, AP4 are surrounded by the isolation structures IS1, IS2, IS3, IS4, respectively. Specifically, the antenna pattern AP1 is offset from a center point of the rectangle ring enclosed by the inner perimeter of the isolation structure IS1; the antenna pattern AP2 is at a center point of the rectangle ring enclosed by the inner perimeter of the isolation structure IS2; the antenna pattern AP3 is offset from the antenna pattern AP1 in both X direction and Y direction; and the antenna pattern AP4 is offset from the antenna pattern AP2 in both X direction and Y direction. In such embodiment, the isolation structures IS1, IS2, IS3 are connected to each other, and the isolation structure IS4 is separated from the other isolation structures IS1, IS2, IS3. It should be noted that an available area A1 may be defined by the isolation structure IS2, the isolation structure IS4, and the edge E1 of a singulated semiconductor package 100 that is formed in the subsequent process flow (FIG. 12). In this case, the available area A1 may be used as for accommodating a laser mark 210 in the subsequent process flow (FIG. 11). Alternatively, there may be another available area A2 defined by the isolation structure IS3, the isolation structure IS4, and the edge E2 of the singulated semiconductor package 100, and the available area A2 is another optional position for accommodating the laser mark 210. In some other embodiments, the isolation structures IS1, IS2, IS3, IS4 may be connected to each other or separated from each other. However, it is appreciated that layouts and arrangements of the antenna patterns and isolation structures may vary depending on the designs or electrical property requirements of the product, and the scope of this disclosure is not limited to the examples and descriptions disclosed above.

In some embodiments, the antenna patterns AP1, AP2, AP3, AP4 each have different functions, such as different transmitting frequencies. Owing to the isolation structures IS, the antenna patterns AP having different transmitting frequencies can be grouped into sets respectively located in different regions defining by the perimeter of the isolation structures IS, so that the interference between the antenna patterns AP having different transmitting frequencies in one package structure and/or among package structures can be suppressed, thereby reducing the surface noise among the antenna patterns AP. In this case, the performance of the package structure is further improved. Alternatively, the antenna patterns AP1, AP2, AP3 may be used as antenna receiver structures, and the antenna pattern AP4 may be used as an antenna transmitter structure.

Figure 3:
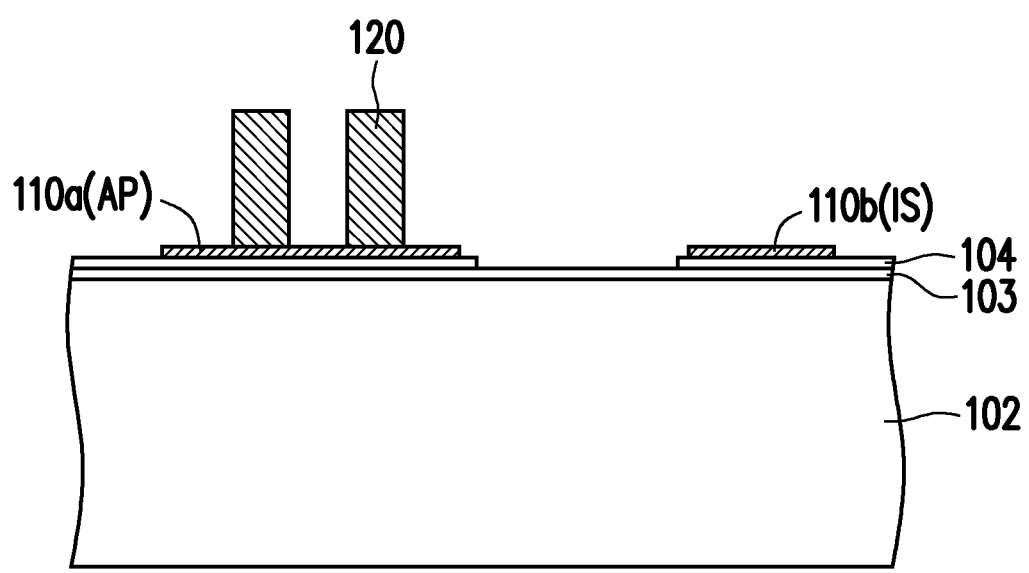

Referring to FIG. 3, a plurality of through insulating vias (TIVs) 120 are formed on the antenna patterns AP over the carrier 102. In some embodiments, the TIVs 120 are formed on the antenna patterns AP and physically connected to the antenna patterns AP. In some embodiments, no TIV is formed on the isolation structures IS of the second conductive pattern 110b, so that the isolation structures IS are electrically floating or the isolation structures IS are electrically isolated from the antenna patterns AP. In some embodiments, the formation of the TIVs 120 includes forming a mask pattern (not shown) with openings, then forming a metallic material (not shown) filling up the openings by electroplating or deposition, and removing the mask pattern to form the TIVs 120. A material of the TIVs 120 may include copper, copper alloys, nickel, tungsten or other suitable metal materials. However, it is appreciated that the scope of this disclosure is not limited to the materials and descriptions disclosed above.

Figure 4:
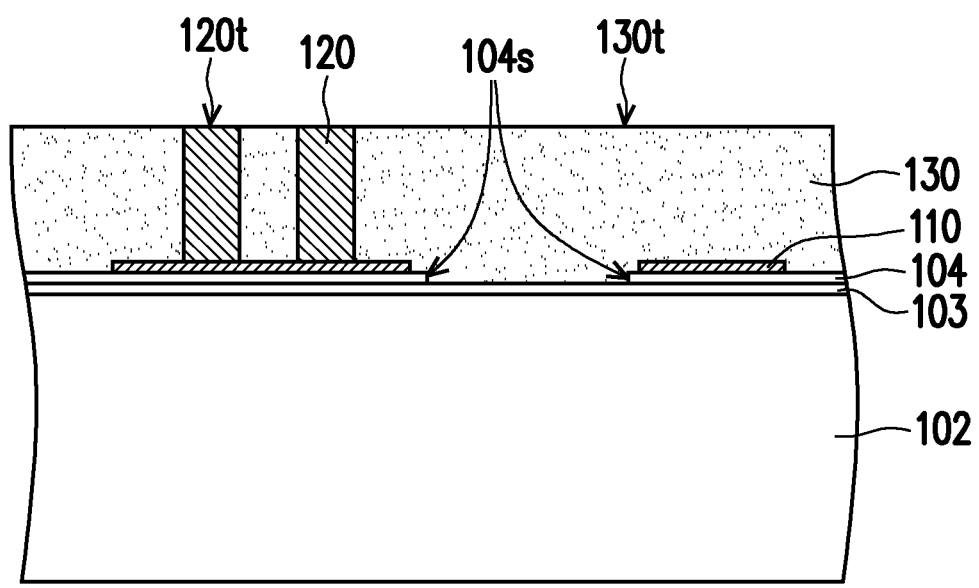

Referring to FIG. 4, an encapsulant 130 is formed over the carrier 102. In some embodiments, the encapsulant 130 laterally encapsulates the TIVs 120, fills between the TIVs 120, covers the conductive layer 110, extends between the facing sidewalls 104s of the dielectric layer 104, and further contact the de-bonding layer 103. In certain embodiments, the encapsulant 130 laterally encapsulates the TIVs 120 but top surfaces 120t of the TIVs 120 are exposed. In such embodiment, the encapsulant 130 is formed by completely encapsulating the TIVs 120 and then performing a planarization process to partially remove the encapsulant 130 to expose the top surfaces 120t of the TIVs 120. That is, the top surface 130t of the encapsulant 130 is coplanar and/or level with the top surfaces 120t of the TIVs 120. In some embodiments, the encapsulant 130 includes a molding compound, a molding underfill, a resin such as epoxy, a combination thereof, or the like. In some alternative embodiments, the encapsulant 130 includes a base material and a plurality of filler particles in the base material. In such embodiment, the base material may be a polymer, a resin, an epoxy, or the like; and the filler particles may be dielectric particles of $SiO_2$, $Al_2O_3$, silica, or the like, and may have spherical shapes. In some alternative embodiments, the filler particles may be solid or hollow. Also, the filler particles may have a plurality of different diameters.

Figure 5:
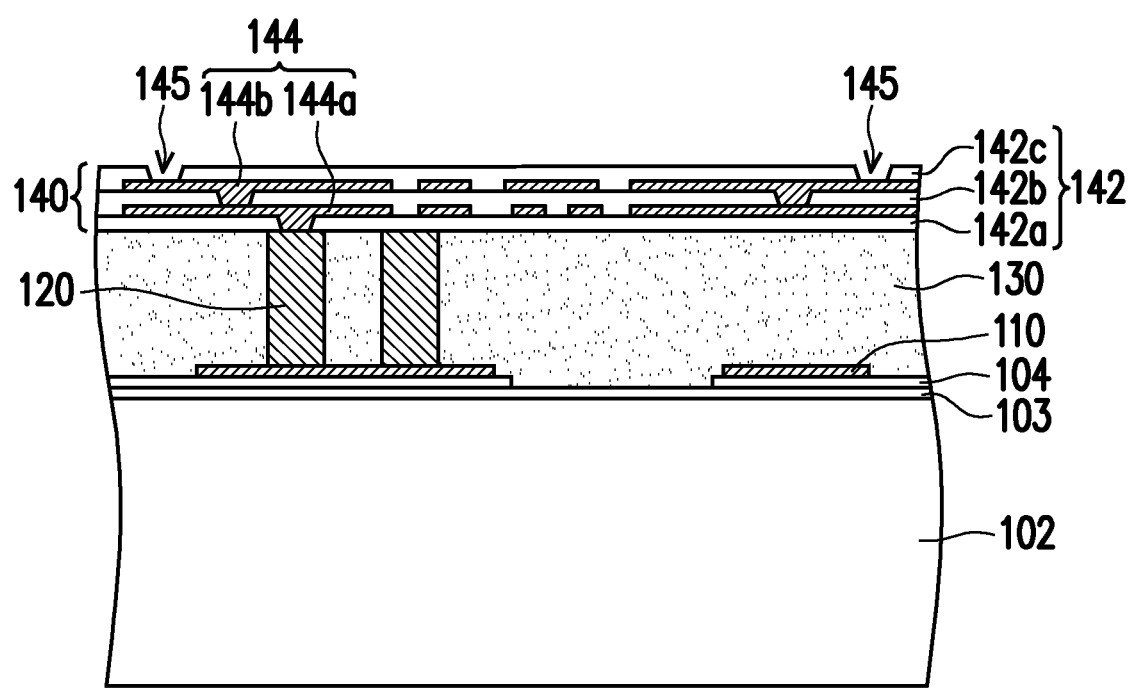

Referring to FIG. 5, a redistribution structure 140 is formed on the encapsulant 130 and on the TIVs 120. Specifically, the redistribution structure 140 may include a plurality of polymer layers 142 (e.g., 142a, 142b, 142c) and a plurality of redistribution layers 144 (e.g., 144a, 144b) stacked alternately. The number of the polymer layers or the redistribution layers is not limited by the disclosure.

In some embodiments, the redistribution layer 144a penetrates through the polymer layer 142a to electrically connect to the TIVs 120. The redistribution layer 144b penetrates through the polymer layer 142b and is electrically connected to the redistribution layer 144a. The polymer layer 142c is patterned to form a plurality of via holes 145 exposing the underlying redistribution layer 144b. In some embodiments, the polymer layers 142 include a photosensitive material such as polybenzoxazole (PBO), polyimide (PI), benzocyclobutene (BCB), a combination thereof or the like. In some embodiments, the redistribution layers 144 include conductive materials. The conductive materials include metal such as copper, nickel, titanium, a combination thereof or the like, and are formed by an electroplating process. In some embodiments, the redistribution layers 144 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the redistribution layers 144 respectively includes a plurality of vias and a plurality of traces connected to each other. The vias penetrate through the polymer layers 142 and connect to the traces, and the traces are respectively located on the polymer layers 142, and are respectively extending on the top surfaces of the polymer layers 142.

Figure 6:
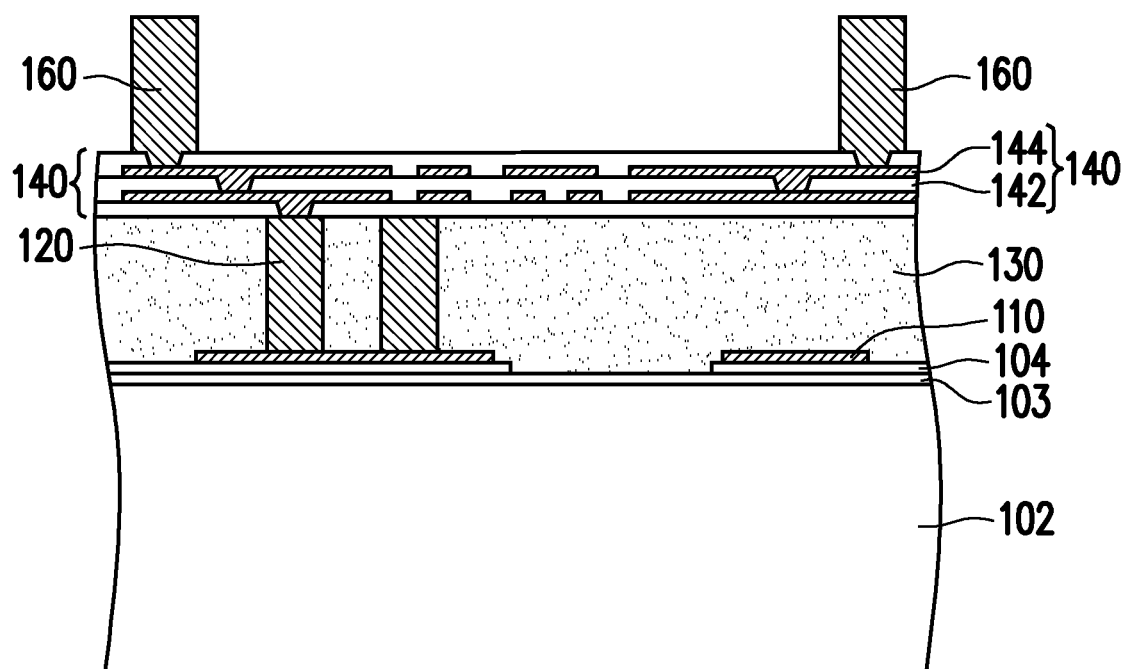

Referring to FIG. 6, a plurality of through vias 160 are formed on the redistribution structure 140 to electrically connect the redistribution layers 144 in the redistribution structure 140. In detail, the through vias 160 may be formed in the via holes 145 and extend upward a certain length. In some embodiments, the formation of the through vias 160 includes forming a mask pattern (not shown) with openings corresponding to the via holes 145, then forming a metallic material (not shown) filling up the openings and the via holes 145 by electroplating or deposition, and removing the mask pattern to form the through vias 160. A material of the through vias 160 may include copper, copper alloys, nickel, tungsten or other suitable metal materials. However, it is appreciated that the scope of this disclosure is not limited to the materials and descriptions disclosed above.

Figure 7:
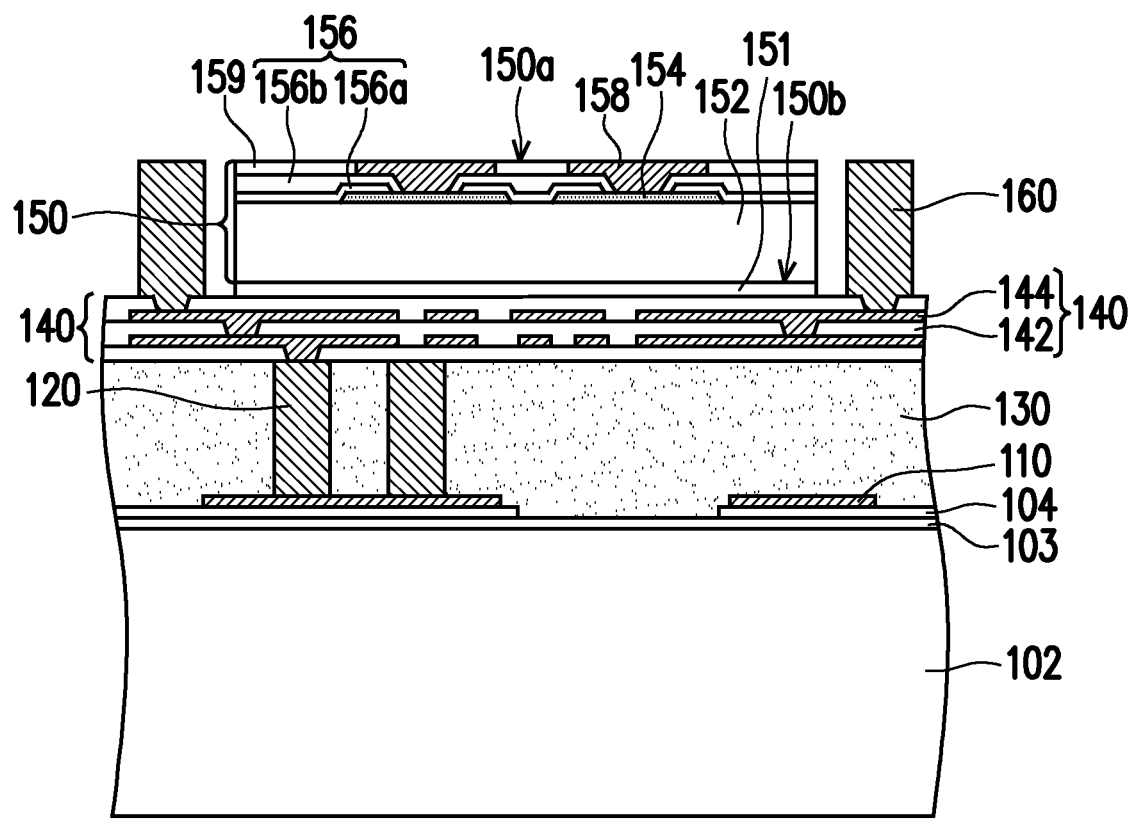

Referring to FIG. 7, a die 150 is picked and placed between the through vias 160. In some embodiments, the die 150 is adhered onto the redistribution structure 140 between the through vias 160 through a die-attach film (DAF) 151 or the like. A material of the DAF 151 may include a phenolic base material or an epoxy base material. The die 150 is surrounded by the through vias 160. In such embodiment, the die 150 has an active surface (e.g., front side) 150a facing upside and an inactive surface (e.g., backside) 150b facing the DAF 151. In this case, the redistribution structure 140 may be referred to as a backside redistribution structure.

Specifically, the die 150 may include a substrate 152, a plurality of pads 154, a passivation layer 156, and a plurality of contacts 158. In some embodiments, the substrate 152 may be made of silicon or other semiconductor materials. For example, the substrate 152 may be a silicon bulk wafer. Alternatively, or additionally, the substrate 152 may include other elementary semiconductor materials such as germanium. In some embodiments, the substrate 152 is made of a compound semiconductor such as silicon carbide, gallium arsenic, indium arsenide or indium phosphide. In some embodiments, the substrate 152 is made of an alloy semiconductor such as silicon germanium, silicon germanium carbide, gallium arsenic phosphide, or gallium indium phosphide. Furthermore, the substrate 152 may be a semiconductor on insulator such as silicon on insulator (SOI) or silicon on sapphire.

The pads 154 may be formed and distributed on the substrate 152. In some embodiments, the pads 154 includes a metal material, such as aluminum, copper, nickel, gold, silver, tungsten, or a combination thereof. The pads 154 may be formed by depositing a metal material layer through a suitable process, such as electro-chemical plating process, CVD, atomic layer deposition (ALD), PVD or the like, and then patterning the metal material layer.

The passivation layer 156 may conformally cover the top surface of the substrate 152 and extends on a portion of the top surface of the pads 154. That is, another portion of the top surface of the pads 154 are exposed by the passivation layer 156. In some embodiments, the passivation layer 156 includes silicon oxide, silicon nitride, benzocyclobutene (BCB) polymer, polyimide (PI), polybenzoxazole (PBO) or a combination thereof and is formed by a suitable process, such as spin coating, CVD or the like. In one embodiment, the passivation layer 156 may be a single-layered structure, a bi-layered structure, or a multi-layered structure. As shown in FIG. 7, the passivation layer 156 may include a first passivation material 156a and a second passivation material 156b formed on the first passivation material 156a. The passivation materials 156a and 156b may have different materials. For example, the first passivation material 156a may include silicon nitride, while the second passivation material 156b may include polyimide (PI) or any material different from silicon nitride.

The contacts 158 may be formed on the pads 154 exposed by the passivation layer 156 to electrically or physically connect the pads 154. In some embodiments, the contacts 158 may include solder bumps, gold bumps, copper bumps, copper posts, or the like. The term "copper posts" refers to copper protrusions, copper through vias, thick copper pads, and/or copper-containing protrusions. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum, or zirconium, etc. The contacts 158 are formed by physical vapor deposition (PVD) or electroplating, for example.

Alternatively, the die 150 further includes a protection layer 159 formed on the passivation layer 156 and laterally encapsulating the contacts 158. In some embodiments, the protection layer 159 includes an organic dielectric material, an inorganic material, or a combination thereof. The organic dielectric material may include a polymer material, such as polybenzoxazole (PBO), polyimide (PI), benzocyclobutene (BCB), the like, or a combination thereof. The inorganic material may include silicon oxide, silicon nitride, silicon oxynitride, the like, or a combination thereof. The protection layer 159 may be formed by deposing a protection material to fully encapsulate the contacts 158 through a suitable process, such as spin coating, CVD or the like, and then performing a planarization process to partially remove the protection material to expose the top surface of the contacts 158. That is, the top surface of the contacts 158 is coplanar and level with the top surface of the protection layer 159.

In some embodiments, the die 150 includes a radio frequency (RF) die (e.g., wireless and radio frequency die), a baseband die, a logic die (e.g., central processing unit, microcontroller, etc.), a memory die (e.g., dynamic random access memory (DRAM) die, static random access memory (SRAM) die, etc.), a power management die (e.g., power management integrated circuit (PMIC) die), a sensor die, a micro-electro-mechanical-system (MEMS) die, a signal processing die (e.g., digital signal processing (DSP) die), a front-end die (e.g., analog front-end (AFE) dies), an application-specific integrated circuit ("ASIC") die, the like, or a combination thereof. Although the die 150 illustrated in FIG. 7 is a single die between the through vias 160, the embodiments of the present invention are not limited thereto. In other embodiments, one or more dies 150 are disposed on the redistribution structure 140 and laterally surrounded by the through vias 160. In such embodiment, the dies 150 may be different sizes (e.g., different heights and/or surface areas) and/or different functions. In other embodiments, the dies 150 may be the same size (e.g., same heights and/or surface areas) and/or the same function.

Figure 8:
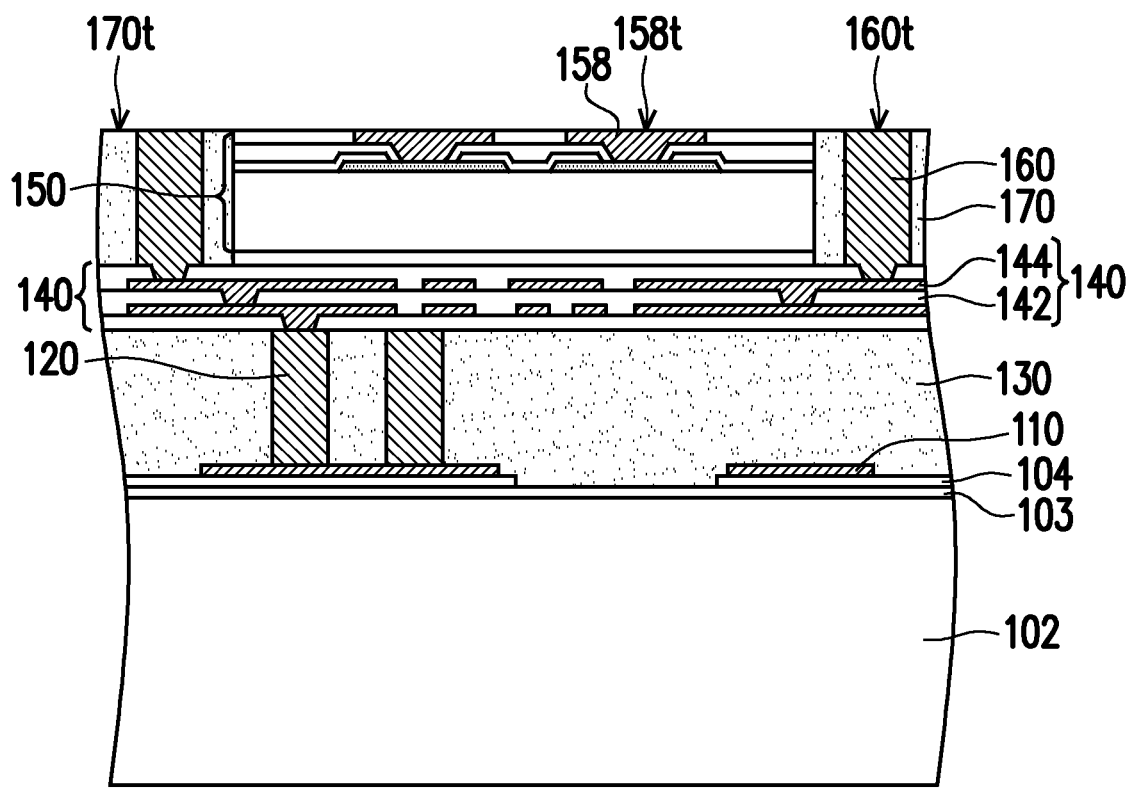

Referring to FIG. 8, an encapsulant 170 is formed on the redistribution structure 140 to laterally encapsulating the die 150 and the through vias 160, but the top surfaces 160t of the through vias 160 and the top surfaces 158t of the contacts 158 are exposed. In some embodiments, the encapsulant 170 is formed by completely encapsulating the die 150 and the through vias 160, and then a planarization process is performed to partially remove the encapsulant 170 to expose the top surfaces 160t of the through vias 160 and the top surfaces 158t of the contacts 158. That is, the top surface 170t of the encapsulant 170 is coplanar and/or level with the top surfaces 160t of the through vias 160 and the top surfaces 158t of the contacts 158. In some embodiments, the encapsulant 170 includes a molding compound, a molding underfill, a resin such as epoxy, a combination thereof, or the like. In some alternative embodiments, the encapsulant 170 includes a base material and a plurality of filler particles in the base material. In such embodiment, the base material may be a polymer, a resin, an epoxy, or the like; and the filler particles may be dielectric particles of $SiO_2$, $Al_2O_3$, silica, or the like, and may have spherical shapes. In some alternative embodiments, the filler particles may be solid or hollow. Also, the filler particles may have a plurality of different diameters.

Figure 9:
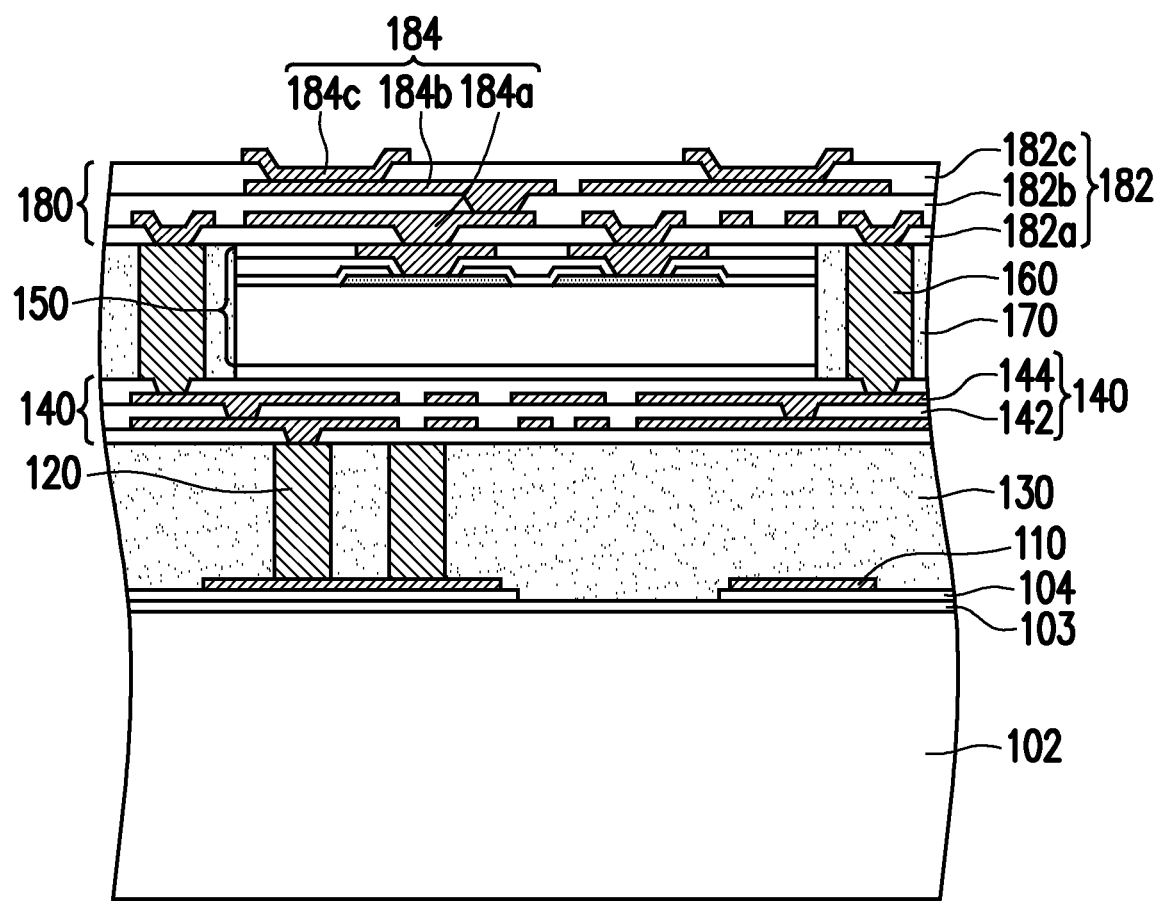

Referring to FIG. 9, a redistribution structure 180 is formed on the die 150, on the through vias 160, and on the encapsulant 170. In some embodiments, the redistribution structure 180 is formed on the active surface 150a of the die. Accordingly, the redistribution structure 180 may be referred to as a front side redistribution structure. Specifically, the redistribution structure 180 may include a plurality of polymer layers 182 (e.g., 182a, 182b, 182c) and a plurality of redistribution layers 184 (e.g., 184a, 184b, 184c) stacked alternately. The number of the polymer layers or the redistribution layers is not limited by the disclosure.

In some embodiments, the redistribution layer 184a penetrates through the polymer layer 182a to electrically connect to the contacts 158 of the die 150 and the through vias 160. The redistribution layer 184b penetrates through the polymer layer 182b and is electrically connected to the redistribution layer 184a. The redistribution layer 184c penetrates through the polymer layer 182c and is electrically connected to the redistribution layer 184b. In some embodiments, the polymer layers 182 include a photo-sensitive material such as polybenzoxazole (PBO), polyimide (PI), benzocyclobutene (BCB), a combination thereof or the like. In some embodiments, the redistribution layers 184 include conductive materials. The conductive materials include metal such as copper, nickel, titanium, a combination thereof or the like, and are formed by an electroplating process. In some embodiments, the redistribution layers 184 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the redistribution layers 184 respectively includes a plurality of vias and a plurality of traces connected to each other. The vias penetrate through the polymer layers 182 and connect to the traces, and the traces are respectively located on the polymer layers 182, and are respectively extending on the top surfaces of the polymer layers 182. In some embodiments, the topmost redistribution layer 184c is also referred to as under-ball metallurgy (UBM) layer for ball mounting.

Figure 10:
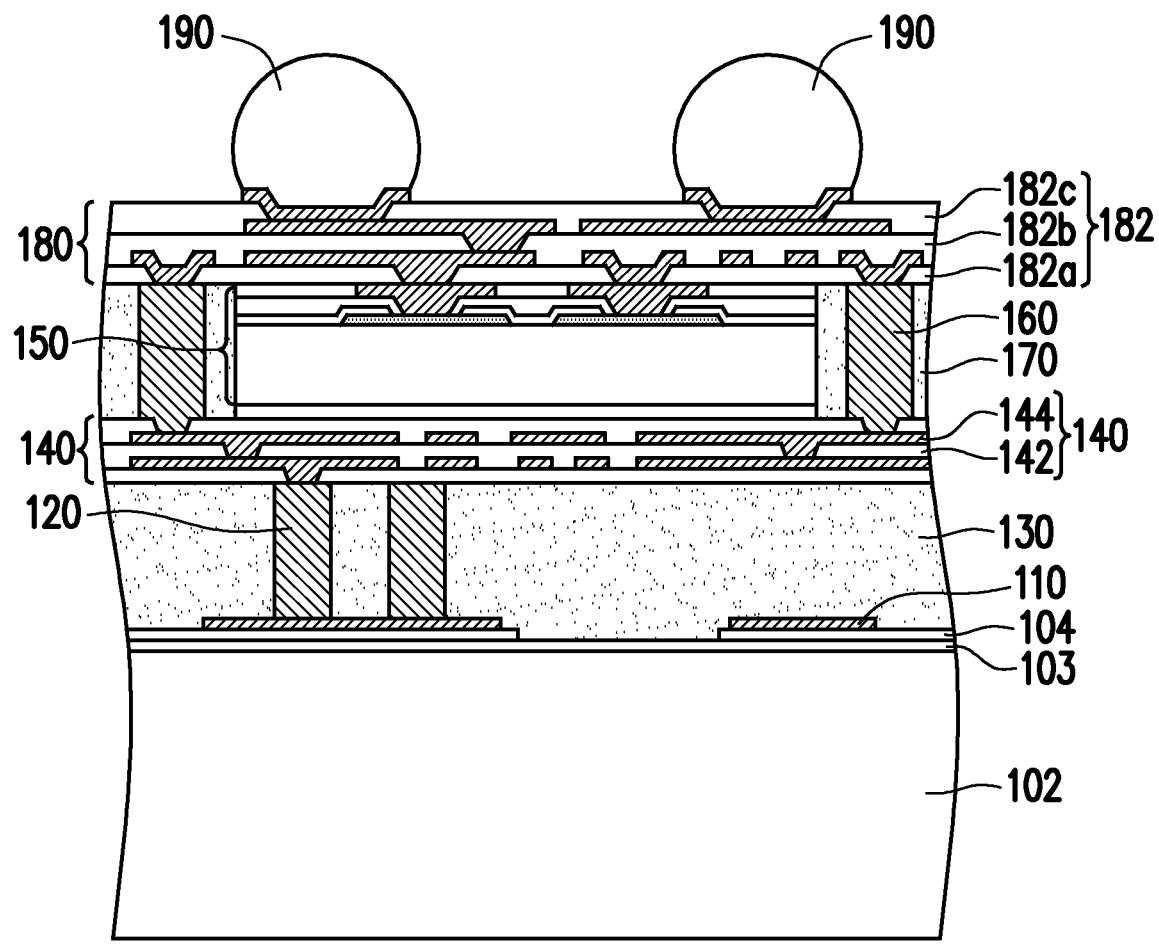

Referring to FIG. 10, a plurality of conductive terminals 190 are formed on and electrically connected to the redistribution layer 184c of the redistribution structure 180. In some embodiments, the conductive terminals 190 are made of a conductive material with low resistivity, such as Sn, Pb, Ag, Cu, Ni, Bi or an alloy thereof, and are formed by a suitable process such as evaporation, plating, ball drop, screen printing, or a ball mounting process. The conductive terminals 190 may be electrically connected to the die 150 through the redistribution structure 180. In addition, the conductive terminals 190 may be electrically connected to the antenna patterns AP through the redistribution structure 180, the through vias 160, the redistribution structure 140, and the TIVs 120.

Alternatively, one or more integrated passive devices (IPDs) may be formed on the redistribution structure 180. In some embodiments, the IPDs are capacitors, resistors, inductors and/or the like, for example.

Referring to FIG. 11, the structure illustrated in FIG. 10 is flipped and mounted on a tape 192 held tightly by a frame 194. The tape 192 helps to provide support, so that the carrier 102 and the de-bonding layer 103 may be removed. In some embodiments, the de-bonding layer 103 may be formed of an adhesive such as an Ultra-Violet (UV) glue, a LTHC glue, or the like, or other types of adhesives. The de-bonding layer 103 is decomposable under the heat of light, thereby releasing the carrier 102 from the underlying structure. After releasing the carrier 102, as shown in FIG. 11, the upper surface 130u (i.e., the backside surface) of the encapsulant 130 and the upper surface 104u of the dielectric layer 104 are exposed, and the upper surface 130u of the encapsulant 130 is coplanar or level with the upper surface 104u of the dielectric layer 104.

After releasing the carrier 102, a laser marking 200 is performed on the upper surface 130u of the encapsulant 130 to form a laser mark 210 in the encapsulant 130. In some embodiments, the laser mark 210 includes a trench formed in the encapsulant 130. In detail, the laser marking 200 is performed by using a laser beam, which burns and removes a portion of the encapsulant 130. In some embodiments, the laser mark 210 includes a letter, a digit, a figure, or any other symbols that can be used for identification purpose. Therefore, the laser mark 210 may be used to identify the product, the manufacturing sequence, or any other information that is used to track the respective package.

Since the dielectric layer 104, such as polyimide layer, may be ablated or melted by the laser marking 200, the laser mark formed in the dielectric layer 104 is blurred and unclear to identify. Therefore, in the present embodiment, the dielectric layer 104 may be patterned before forming the encapsulant 130. In such embodiment, the encapsulant 130 is extend between the facing sidewalls 104s of the dielectric layer 104 (see FIG. 4), and the upper surface 130u of the encapsulant 130 is exposed by and/or level with the upper surface 104u of the dielectric layer 104, thereby facilitating the laser marking 200. In this case, the laser marking 200 is only performed on the encapsulant 130, not in the dielectric layer 104, as shown in FIG. 11. After performing the laser marking 200, the laser mark 210 formed in the encapsulant 130 is clearly seen for alignment or identification during subsequent operations.

Referring to FIG. 12, a dicing process or a singulation process is performed. In some embodiments, the dicing process is performed to cut the whole structure along the cutting lines 196 into individual and separate semiconductor packages 100 (only one semiconductor package 100 is shown in the drawings). In one embodiment, the dicing process is a wafer dicing process including mechanical blade sawing or laser cutting.

Figure 13:
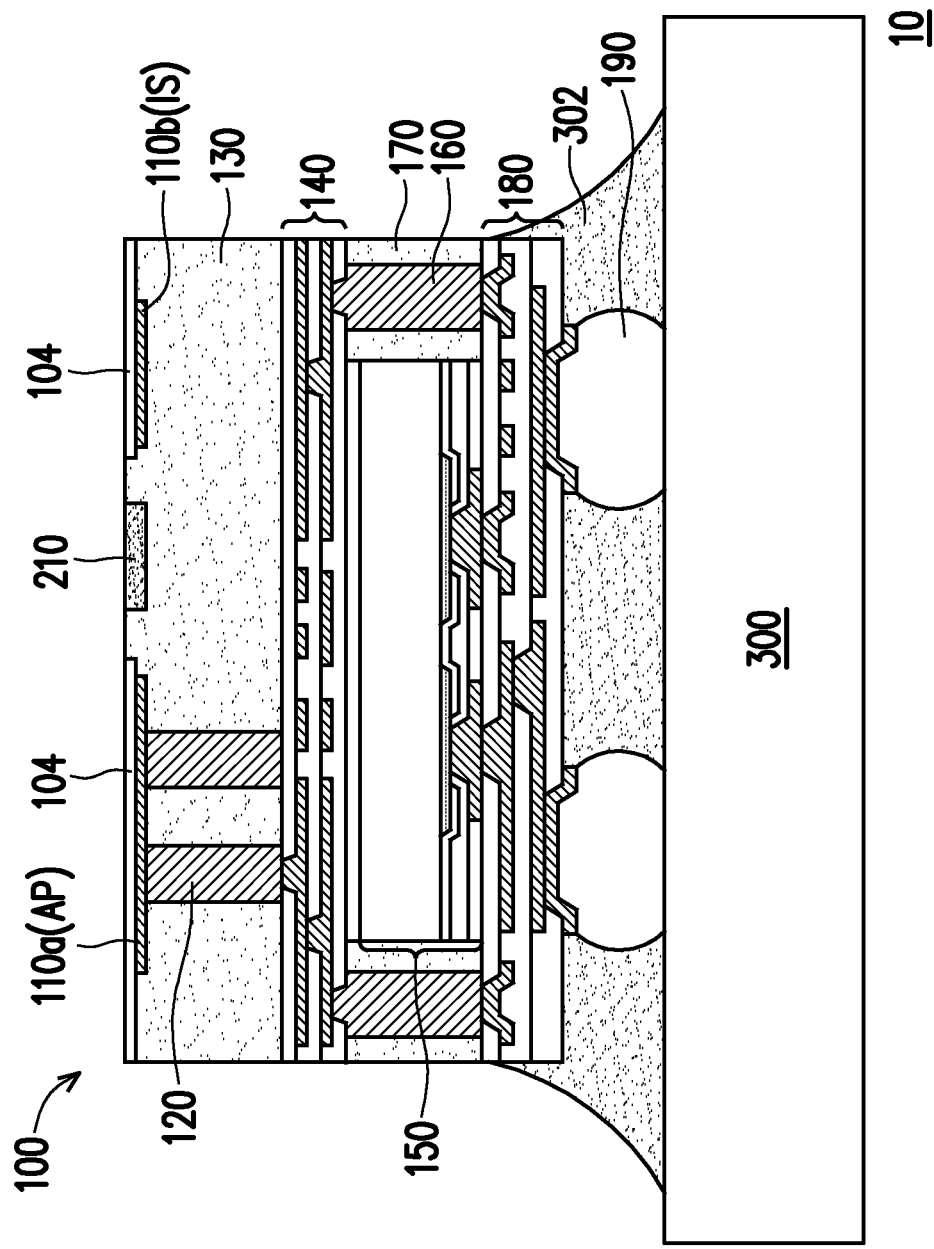
Figure 14:
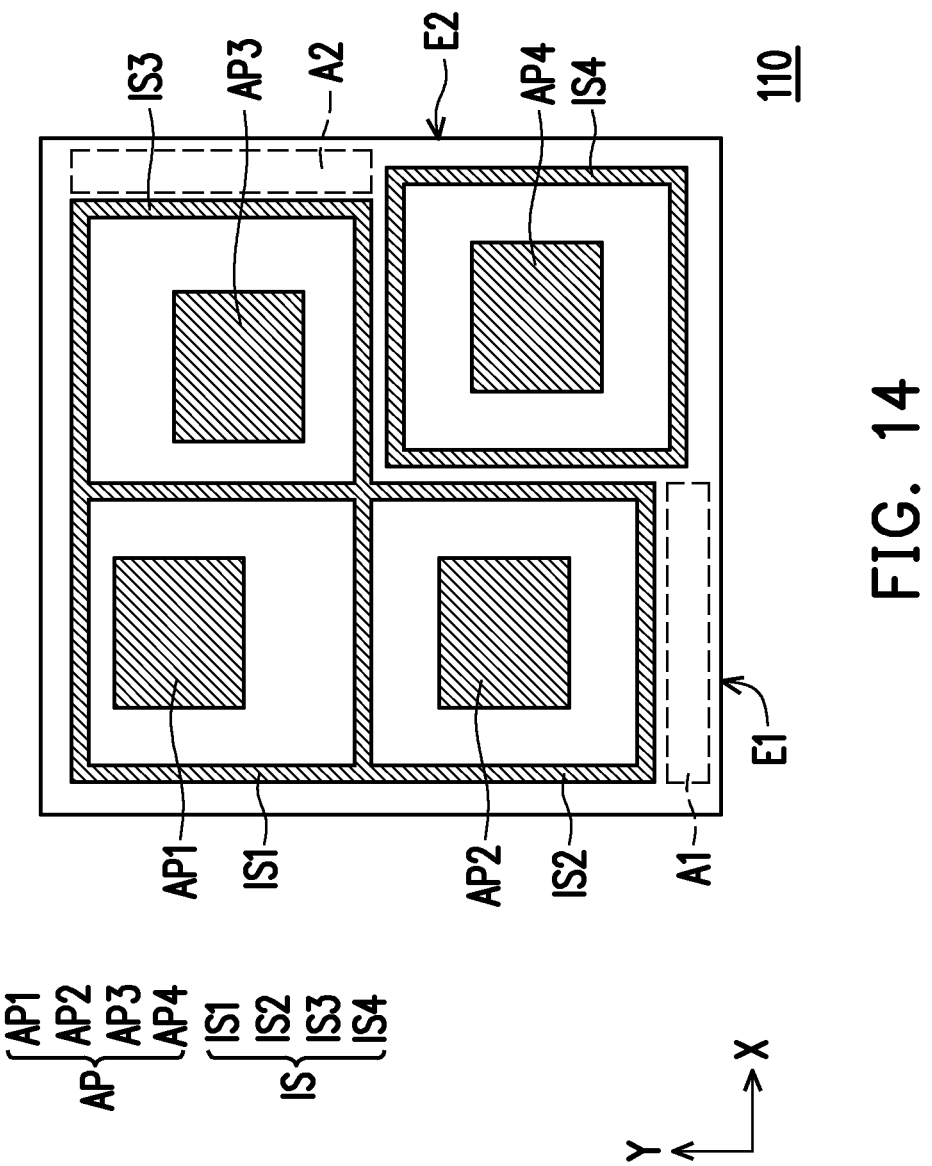
FIG. 14 is a schematic top view illustrating a relative position between antenna patterns and isolation structures of a package structure in accordance with some embodiments.

Referring to FIG. 13, the semiconductor package 100 with the laser mark 210 is bonded onto a circuit substrate 300 through the conductive terminals 190, thereby accomplishing a package structure 10. In some embodiments, the circuit substrate 300 is an organic flexible substrate, a printed circuit board, or the like. In this case, the package structure 10 may be referred to as an integrated fan-out on substrate (InFO_oS) structure. Alternatively, the circuit substrate 300 may be another semiconductor package with different functions from the semiconductor package 100. In such embodiment, the package structure 10 is referred to as a package-on-package (PoP) structure.

In addition, the package structure 10 further includes an underfill 302 laterally encapsulating the conductive terminals 190. In some embodiments, the underfill 302 may be any acceptable material, such as a polymer, epoxy, molding underfill, or the like. The underfill 302 may be formed by a capillary flow process after the upper package 100 is attached or may be formed by a suitable deposition method before the upper package 100 is attached.

FIG. 15 to FIG. 21 are cross-sectional views of a method of fabricating a package structure in accordance with some alternative embodiments.

Figure 15:
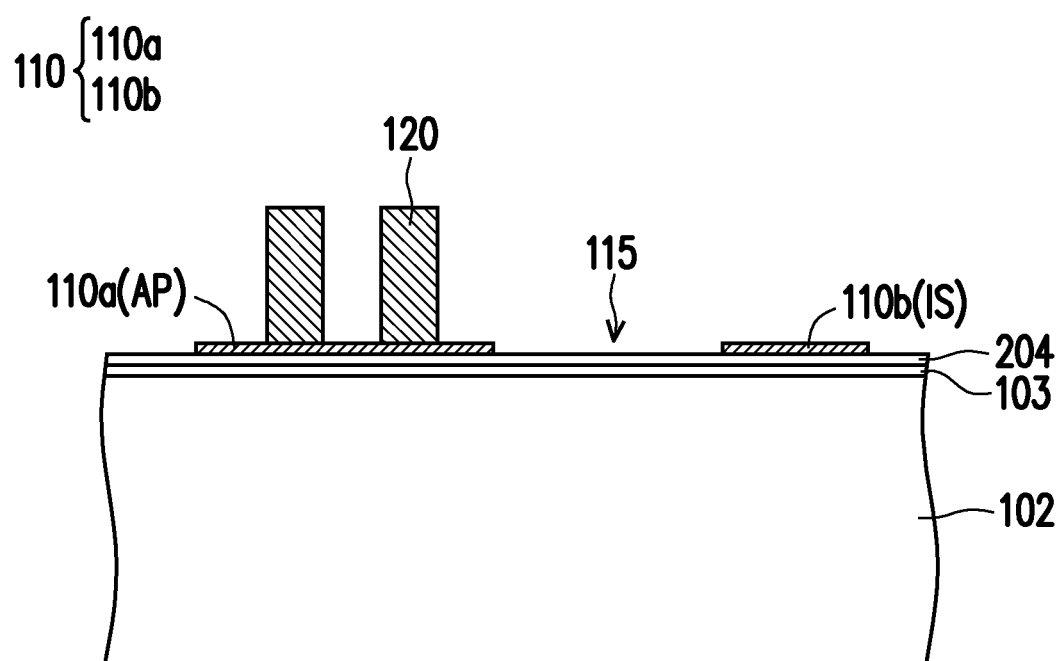
FIG. 15 to FIG. 21 are cross-sectional views of a method of fabricating a package structure in accordance with some alternative embodiments.

Referring to FIG. 15, the structure illustrated in FIG. 15 is similar to the structure illustrated in FIG. 3, but a dielectric material 204 of FIG. 15 is not patterned. In detail, the dielectric material 204 is formed to extends on the de-bonding layer 103. Thereafter, the conductive layer 110 may be formed by depositing a conductive material (not shown) on the dielectric material 204, and then patterning the conductive material by photolithographic and etching processes to form an opening 115. The opening 115 may expose the underlying dielectric material 204. The (TIVs) 120 are then formed on the antenna patterns AP, not on the isolation structures IS. In some embodiments, the dielectric material 204 may have the same dielectric material as the dielectric layer 104. In addition, the configurations and the materials of the carrier 102, the de-bonding layer 103, the dielectric layer 104, the conductive layer 110, and the TIVs 120 are detail illustrated in the above embodiment, and thus details thereof are omitted herein.

Figure 16:
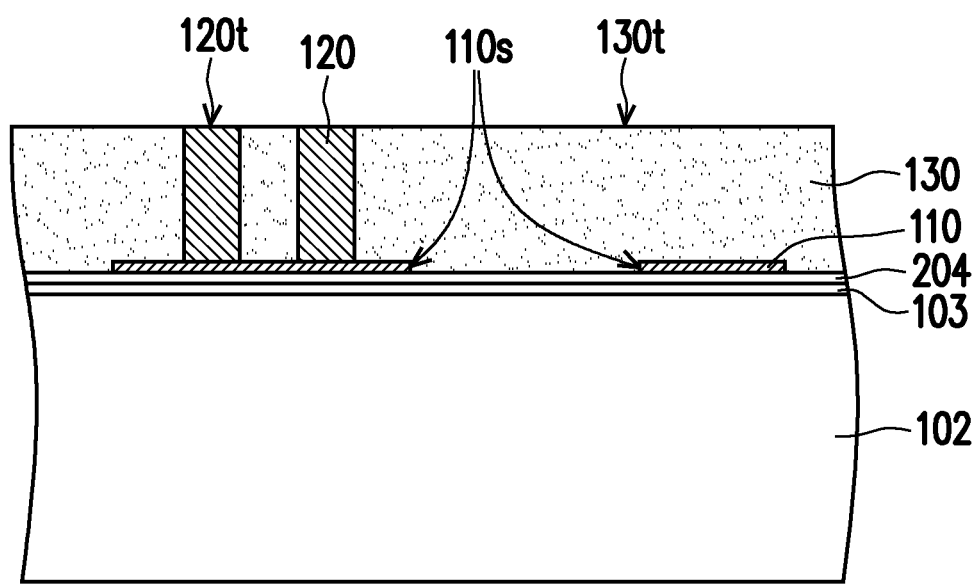

Referring to FIG. 16, the encapsulant 130 is formed over the carrier 102. In some embodiments, the encapsulant 130 laterally encapsulates the TIVs 120, fills between the TIVs 120, covers the conductive layer 110, extends between the facing sidewalls 110s of the conductive layer 110, and further contact the dielectric material 204.

Figure 17:
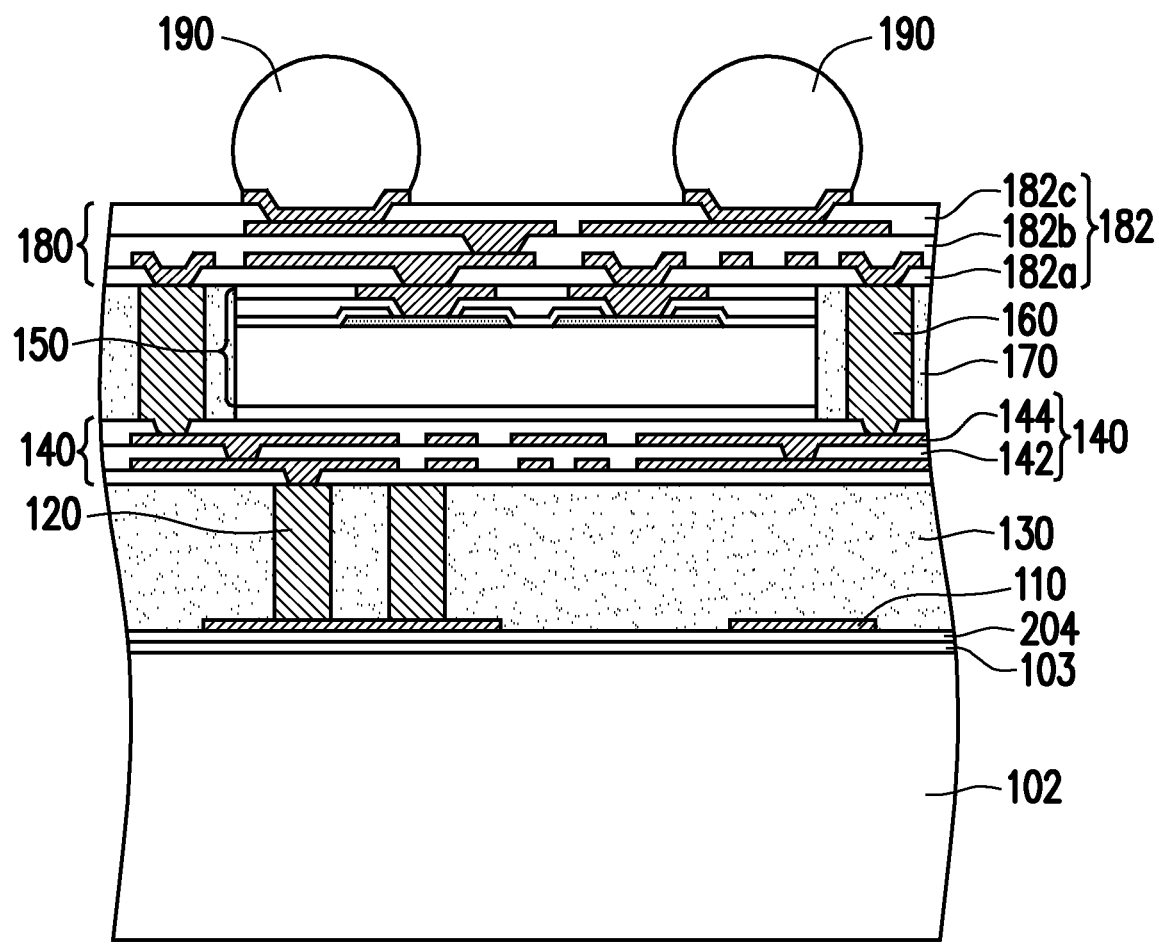

Referring to FIG. 17, the steps illustrated in FIG. 5 to FIG. 10 are performed to form the redistribution structure 140, the through vias 160, the die 150, the redistribution structure 180, and the conductive terminals 190 in order on the encapsulant 130 and the TIVs 120. The forming methods and the materials of the redistribution structure 140, the through vias 160, the die 150, the redistribution structure 180, and the conductive terminals 190 are detail illustrated in the above embodiment, and thus details thereof are omitted herein.

Figure 18:
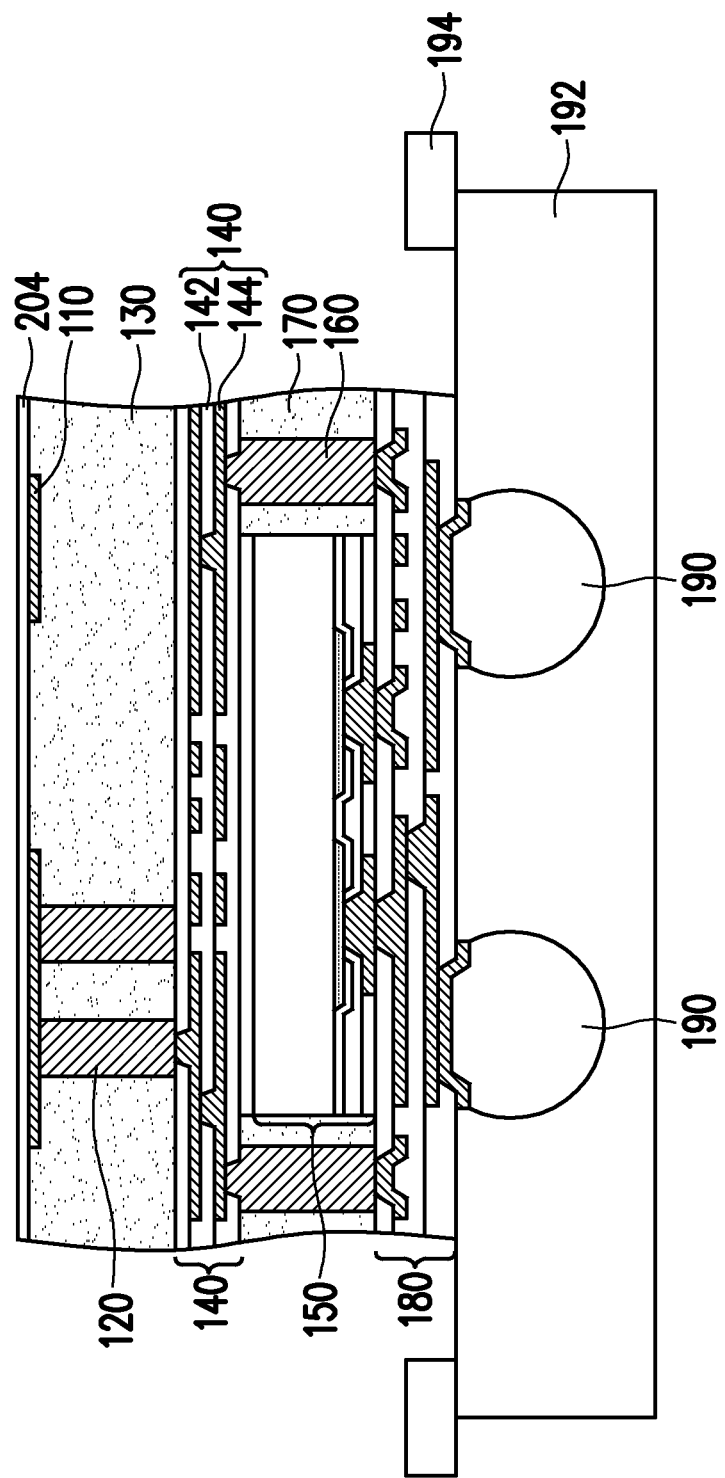

Referring to FIG. 18, the structure illustrated in FIG. 17 is flipped and mounted on a tape 192 held tightly by a frame 194. The tape 192 helps to provide support, so that the carrier 102 and the de-bonding layer 103 may be removed. After releasing the carrier 102, the dielectric material 204 is exposed.

Figure 19:
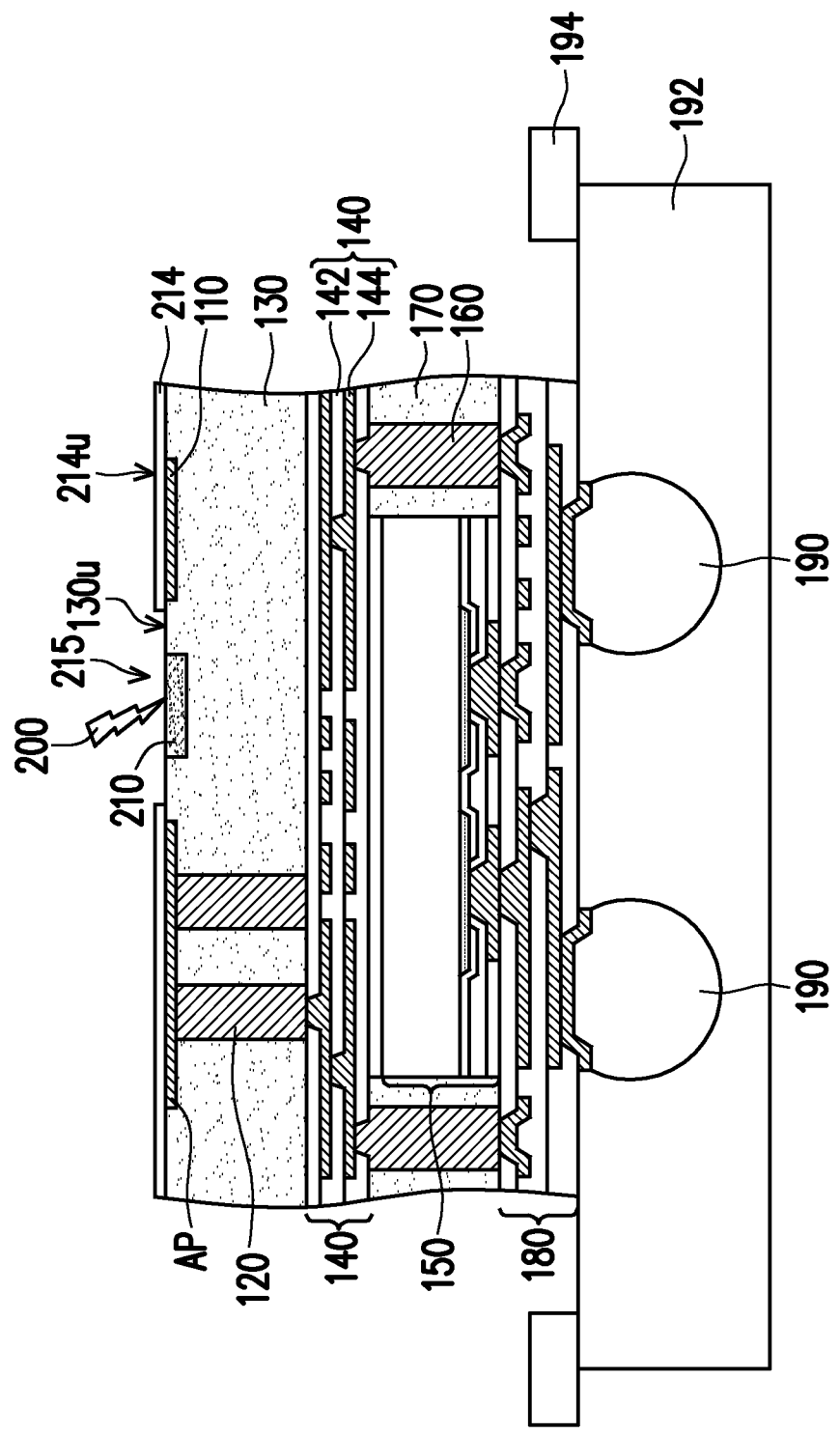

Referring to FIG. 18 and FIG. 19, the dielectric material 204 is patterned to form a dielectric layer 214 with an opening 215. As shown in FIG. 19, the opening 215 may expose the upper surface 130u of the encapsulant 130. In this case, the upper surface 130u of the encapsulant 130 is lower than the upper surface 214u of the dielectric layer 214. In some embodiments, the dielectric material 204 is patterned by photolithographic and etching processes until exposing the upper surface 130u of the encapsulant 130.

After patterning the dielectric material 204, a laser marking 200 is performed on the upper surface 130u of the encapsulant 130 to form a laser mark 210 in the encapsulant 130. In some embodiments, the laser marking 200 is performed on the encapsulant 130, in the case of the dielectric layer 214 at least covering the antenna patterns AP, thereby protecting the antenna patterns AP from undesired damages. The laser mark 210 may include a trench formed in the encapsulant 130. In detail, the laser marking 200 is performed by using a laser beam, which burns and removes a portion of the encapsulant 130. In some embodiments, the laser mark 210 includes a letter, a digit, a figure, or any other symbols that can be used for identification purpose. Therefore, the laser mark 210 may be used to identify the product, the manufacturing sequence, or any other information that is used to track the respective package.

Figure 20:
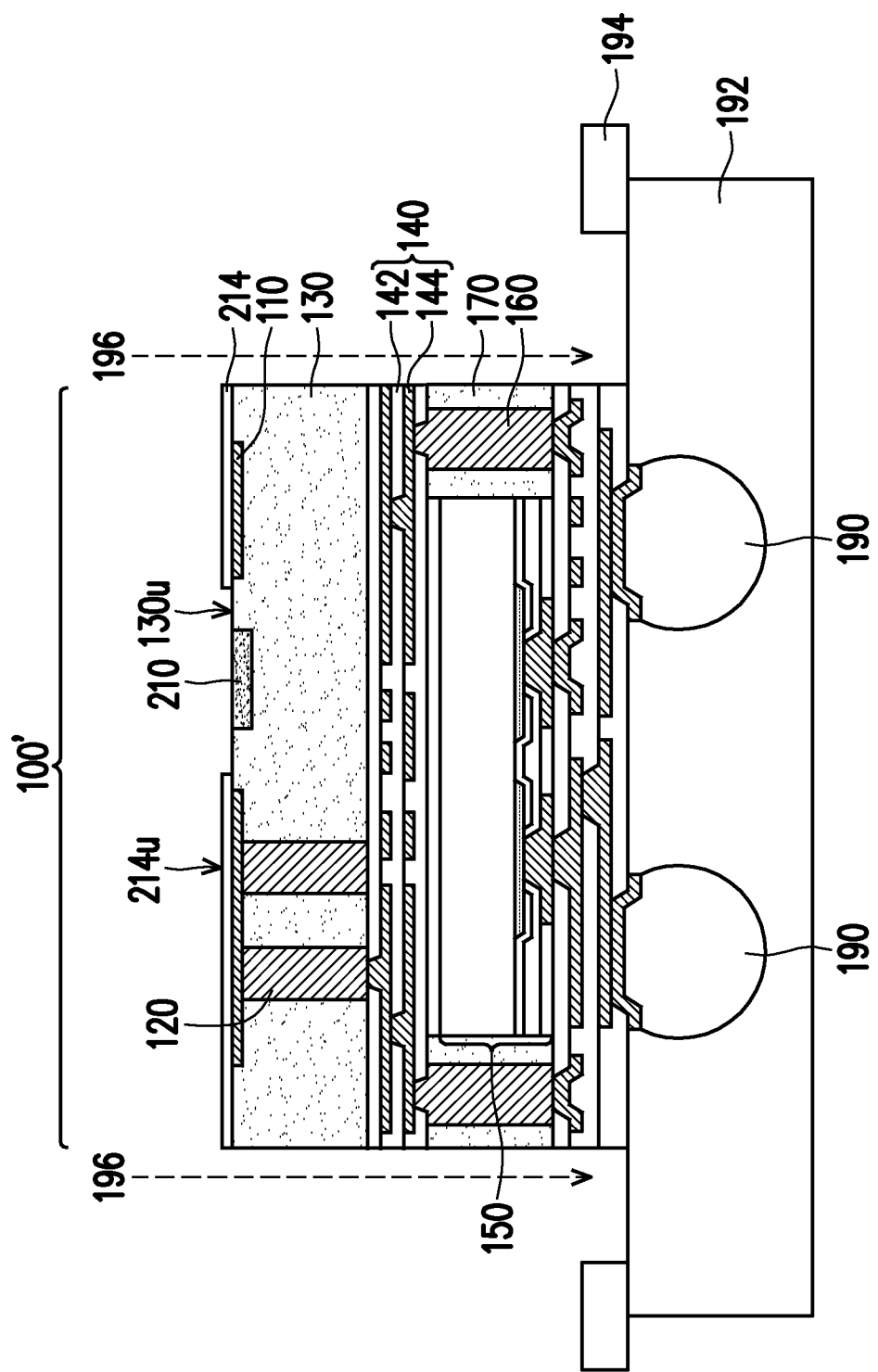

Referring to FIG. 20, a dicing process or a singulation process is performed. In some embodiments, the dicing process is performed to cut the whole structure along the cutting lines 196 into individual and separate semiconductor packages 100' (only one semiconductor package 100' is shown in the drawings). In one embodiment, the dicing process is a wafer dicing process including mechanical blade sawing or laser cutting.

Figure 21:
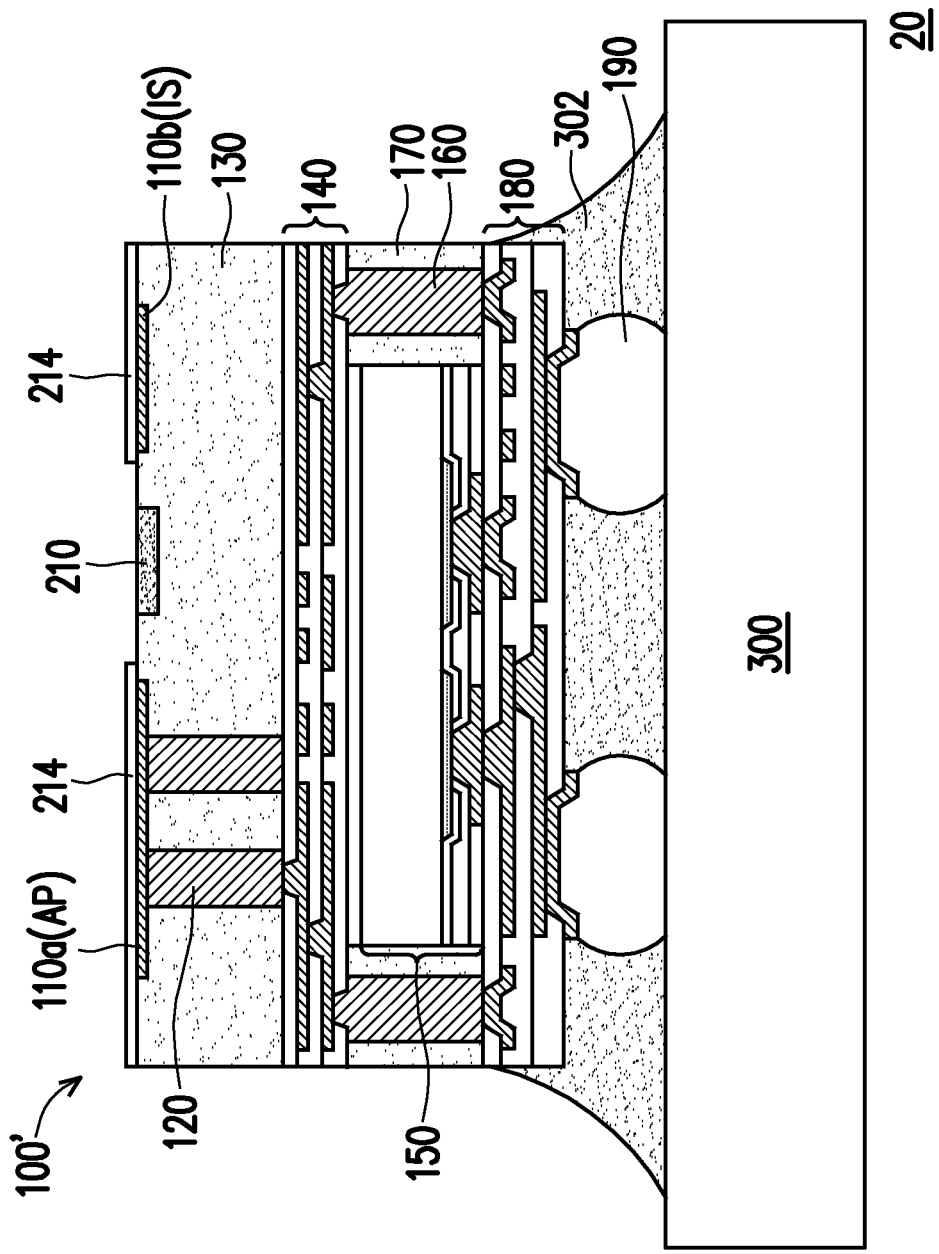

Referring to FIG. 21, the semiconductor package 100' with the laser mark 210 is bonded onto a circuit substrate 300 through the conductive terminals 190, thereby accomplishing a package structure 20.

In accordance with an embodiment, a package structure includes a die; a first encapsulant, laterally encapsulating the die; a first redistribution structure, disposed on the first encapsulant and the die; a second encapsulant, disposed on the first redistribution structure; an antenna pattern, embedded in the second encapsulant and electrically connected to the first redistribution structure; and a dielectric layer, covering the antenna pattern, wherein an upper surface of the second encapsulant is exposed by the dielectric layer, and a laser mark is formed within the upper surface of the second encapsulant.

In accordance with an embodiment, a method of fabricating a package structure includes: forming a dielectric layer on a carrier; forming a conductive layer with at least one antenna pattern on the dielectric layer; forming a plurality of through insulating vias (TIVs) on the at least one antenna pattern; forming an encapsulant to laterally encapsulate the plurality of TIVs, wherein the encapsulant extends between facing sidewalls of the dielectric layer; forming a backside redistribution structure on the encapsulant; mounting a die on the backside redistribution structure; forming a molding compound to laterally encapsulate the die; forming a front side redistribution structure on the die and the molding compound; releasing the carrier to expose the dielectric layer and the encapsulant; and performing a laser marking to form a laser mark in the encapsulant.

In accordance with an embodiment, a method of fabricating a package structure includes: forming a dielectric material on a carrier; forming a conductive layer with at least one antenna pattern on the dielectric material; forming a plurality of through insulating vias (TIVs) on the at least one antenna pattern; forming an encapsulant to laterally encapsulate the plurality of TIVs, wherein the encapsulant extends between facing sidewalls of the conductive layer to contact the dielectric material; forming a backside redistribution structure on the encapsulant; mounting a die on the backside redistribution structure; forming a molding compound to laterally encapsulate the die; forming a front side redistribution structure on the die and the molding compound; releasing the carrier to expose the dielectric material; patterning the dielectric material to form a dielectric layer with an opening, wherein the opening exposes the encapsulant; and performing a laser marking to form a laser mark in the encapsulant exposed by the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a package structure, comprising:
    forming a dielectric layer on a carrier;
    forming a conductive layer with at least one antenna pattern on the dielectric layer;
    forming a plurality of through insulating vias (TIVs) on the at least one antenna pattern;
    forming an encapsulant to laterally encapsulate the plurality of TIVs, wherein the encapsulant extends between facing sidewalls of the dielectric layer;
    forming a backside redistribution structure on the encapsulant;
    mounting a die on the backside redistribution structure;
    forming a molding compound to laterally encapsulate the die;
    forming a front side redistribution structure on the die and the molding compound;
    releasing the carrier to expose the dielectric layer and the encapsulant; and
    performing a laser marking to form a laser mark in the encapsulant.

2. The method of claim 1, wherein the conductive layer further comprises an isolation structure surrounding the at least one antenna pattern and being physically isolated from the at least one antenna pattern.

3. The method of claim 1, wherein after releasing the carrier, an upper surface of the encapsulant is level with an upper surface of the dielectric layer.

4. The method of claim 1, wherein before mounting the die on the backside redistribution structure, the method further comprises forming a plurality of through vias on the backside redistribution structure to laterally surrounding the die.

5. The method of claim 1, wherein after forming the laser mark, the method further comprises:
    performing a dicing process to form a plurality of packages; and
    bonding one of the plurality of packages onto a circuit substrate.

6. A method of fabricating a package structure, comprising:
    forming a dielectric material on a carrier;
    forming a conductive layer with at least one antenna pattern on the dielectric material;
    forming a plurality of through insulating vias (TIVs) on the at least one antenna pattern;
    forming an encapsulant to laterally encapsulate the plurality of TIVs, wherein the encapsulant extends between facing sidewalls of the conductive layer to contact the dielectric material;
    forming a backside redistribution structure on the encapsulant;
    mounting a die on the backside redistribution structure;
    forming a molding compound to laterally encapsulate the die;
    forming a front side redistribution structure on the die and the molding compound;
    releasing the carrier to expose the dielectric material;
    patterning the dielectric material to form a dielectric layer with an opening, wherein the opening exposes the encapsulant; and
    performing a laser marking to form a laser mark in the encapsulant exposed by the opening.

7. The method of claim 6, wherein the conductive layer further comprises an isolation structure surrounding the at least one antenna pattern and being physically isolated from the at least one antenna pattern.

8. The method of claim 6, wherein after releasing the carrier, the dielectric material covers an upper surface of the encapsulant and an upper surface of the at least one antenna pattern.

9. The method of claim 6, wherein the laser marking is performed in case of the dielectric layer covering the at least one antenna pattern.

10. The method of claim 6, wherein an upper surface of the encapsulant is lower than an upper surface of the dielectric layer.

11. The method of claim 6, wherein before mounting the die on the backside redistribution structure, the method further comprises forming a plurality of through vias on the backside redistribution structure to laterally surrounding the die,
- wherein after forming the laser mark, the method further comprises:
- performing a dicing process to form a plurality of packages; and
- bonding one of the plurality of packages onto a circuit substrate.

* * * * *